US006440812B2

(12) United States Patent
Violette

(10) Patent No.: US 6,440,812 B2
(45) Date of Patent: *Aug. 27, 2002

(54) ANGLED IMPLANT TO IMPROVE HIGH CURRENT OPERATION OF BIPOLAR TRANSISTORS

(75) Inventor: Michael Violette, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/436,306

(22) Filed: Nov. 8, 1999

Related U.S. Application Data

(62) Division of application No. 09/024,287, filed on Feb. 17, 1998, now Pat. No. 5,982,022, which is a division of application No. 08/519,817, filed on Aug. 25, 1995, now Pat. No. 5,719,082.

(51) Int. Cl.[7] ...................... H01L 21/331; H01L 21/425

(52) U.S. Cl. ........................ 438/369; 438/525; 438/531

(58) Field of Search ................................ 257/592, 657, 257/593; 438/205, 369–377, 309, 350, 353, 362, 364, 525, 531

(56) References Cited

U.S. PATENT DOCUMENTS

| | | | | |
|---|---|---|---|---|
| 4,994,881 A | * | 2/1991 | Gomi | 257/565 |
| 5,183,768 A | * | 2/1993 | Kameyama et al. | 148/DIG. 10 |
| 5,321,301 A | * | 6/1994 | Sato et al. | 257/592 |
| 5,336,926 A | * | 8/1994 | Matthews | 257/657 |
| 5,344,787 A | * | 9/1994 | Nagalingam | 438/205 |
| 5,471,082 A | * | 11/1995 | Maeda | 257/362 |
| 5,605,849 A | * | 2/1997 | Chen et al. | 438/345 |
| 5,698,459 A | * | 12/1997 | Grubisich et al. | 148/DIG. 10 |

FOREIGN PATENT DOCUMENTS

| | | | |
|---|---|---|---|
| JP | 62-274621 | | 11/1987 |
| JP | 3-48427 | | 3/1991 |
| JP | 7-193153 | * | 7/1995 |

* cited by examiner

*Primary Examiner*—Howard Weiss
*Assistant Examiner*—Marcos D. Pizarro-Crespo
(74) *Attorney, Agent, or Firm*—Schwegman, Lundberg, Woessner & Kluth, P.A.

(57) ABSTRACT

Method and apparatus for improving the high current operation of bipolar transistors while minimizing adverse affects on high frequency response are disclosed. A local implant to increase the doping of the collector at the collector to base interface is achieved by the use of an angled ion implant of collector impurities through the emitter opening. The resulting area of increased collector doping is larger than the emitter opening, which minimizes carrier injection from the emitter to the collector, but is smaller than the area of the base.

48 Claims, 8 Drawing Sheets

1318 1218 1316 1314 1216 1312 P+ BASE P+ N+ PLUG 614 1214 1020 1114 918 COLLECTOR N WELL 414 N+ BURIED LAYER P SUBSTRATE

ANGLED IMPLANT TO IMPROVE HIGH CURRENT OPERATION OF BIPOLAR TRANSISTORS

This application is a divisional of U.S. Ser. No. 09/024,287 filed Feb. 17, 1998, now U.S. Pat. No. 5,982,022 which is a divisional of U.S. Ser. No. 08/519,817, filed Aug. 25, 1995, now U.S. Pat. No. 5,719,082. The present invention relates to semiconductor circuitry and in particular to improving the high current operation of a semiconductor circuit by implanting impurities at an angle to create a local implant with increased area.

FIELD OF THE INVENTION

The present invention relates to semiconductor circuitry and in particular to improving the high current operation of a semiconductor circuit by implanting impurities at an angle to create a local implant with increased area.

BACKGROUND OF THE INVENTION

Semiconductor junctions are often limited in their high current region of operation by leakage currents. In the case of bipolar transistors, as the collector current increases, electron and hole injection increases the base depth into the lightly doped collector region, thus reducing the gain of the transistor. Similar effects are observed in metal oxide semiconductor transistors. One method for improving the high current operation of bipolar transistors include increasing the collector doping concentration throughout its junction with the base via a perpendicular implant of appropriate doping through the base opening as shown in prior art FIG. 1. The peak current at which transistor gain starts to drop off due to high current effects increases, but since the entire collector region vertically adjacent the base is more heavily doped, the base-collector capacitance is significantly increased. Ideally, high current operation should be maximized and base-collector capacitance should be minimized for optimum performance. Similar effects are obtained by increasing the doping of the entire collector region. Since speed is of premium importance in such transistors, there is a need for a solution which does not degrade performance at high frequencies.

A second method shown in prior art FIG. 2 reduces the base-collector capacitance of the first method, which improves the high frequency response, by using a local implant through the emitter to increase the collector doping below the emitter opening only, where the carrier injection into the base mostly occurs at high currents. However, since the highest emitter current density occurs at the emitter edges, scattered carriers bypass the implant around its perimeter, again causing transistor gain loss at high currents. There is a need for both improving the high frequency operation and the high current operation of bipolar transistors without adding many additional processing steps.

SUMMARY OF THE INVENTION

A local collector implant of impurities is created in a bipolar transistor by angling the implant through an emitter opening. The localized implant covers an area larger than the emitter opening, thereby minimizing carrier injection around the perimeter of the implant at high currents. In addition to improved high current operation, high frequency operation is also improved over previous methods of increasing the entire collector doping concentration where it contacts the base or performing a conventional local collector implant through the emitter opening. Only one additional implant is required over normal bipolar transistor formation processes, and no additional masking is required In one preferred embodiment, a standard ion beam source using phosphorus as the impurity for a npn transistor is used to perform the angled implant For a pnp transistor, a p source of impurities is used, such as boron. The impurities are accelerated from the ion source, and a mass spectrometer is used to separate undesired impurities. A high energy, fairly narrow ion beam is focussed and scanned across the emitter opening at an angle to a line perpendicular to the surface of the emitter, resulting in a wider implant at the collector-base junction, which injected carriers have a harder time circumventing. The angling of the beam is accomplished by tilting the silicon wafer on which the transistor is being formed with respect to the source of ions.

DESCRIPTION OF THE PREFERRED EMBODIMENT

In the following detailed description of the preferred embodiment, reference is made to the accompanying drawings which form a part hereof and in which is shown by way of illustration specific preferred embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present inventions. The following detailed description is, therefore, not to be taken in a limiting sense, and the scope of the present inventions is defined only by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

Figure 1:
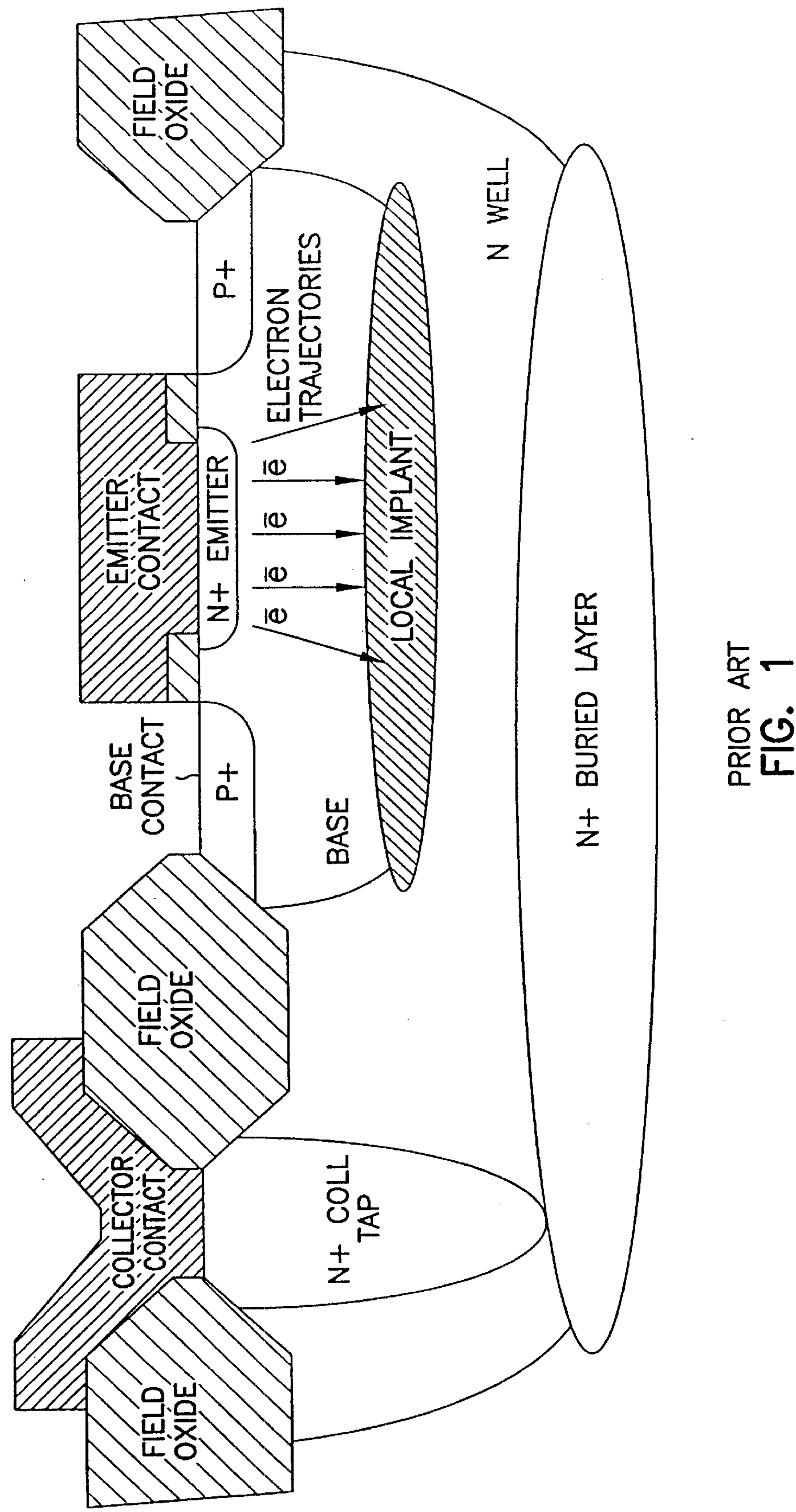
FIG. 1 is a cross section of a prior art semiconductor transistor showing an increased collector doping.
Figure 2:
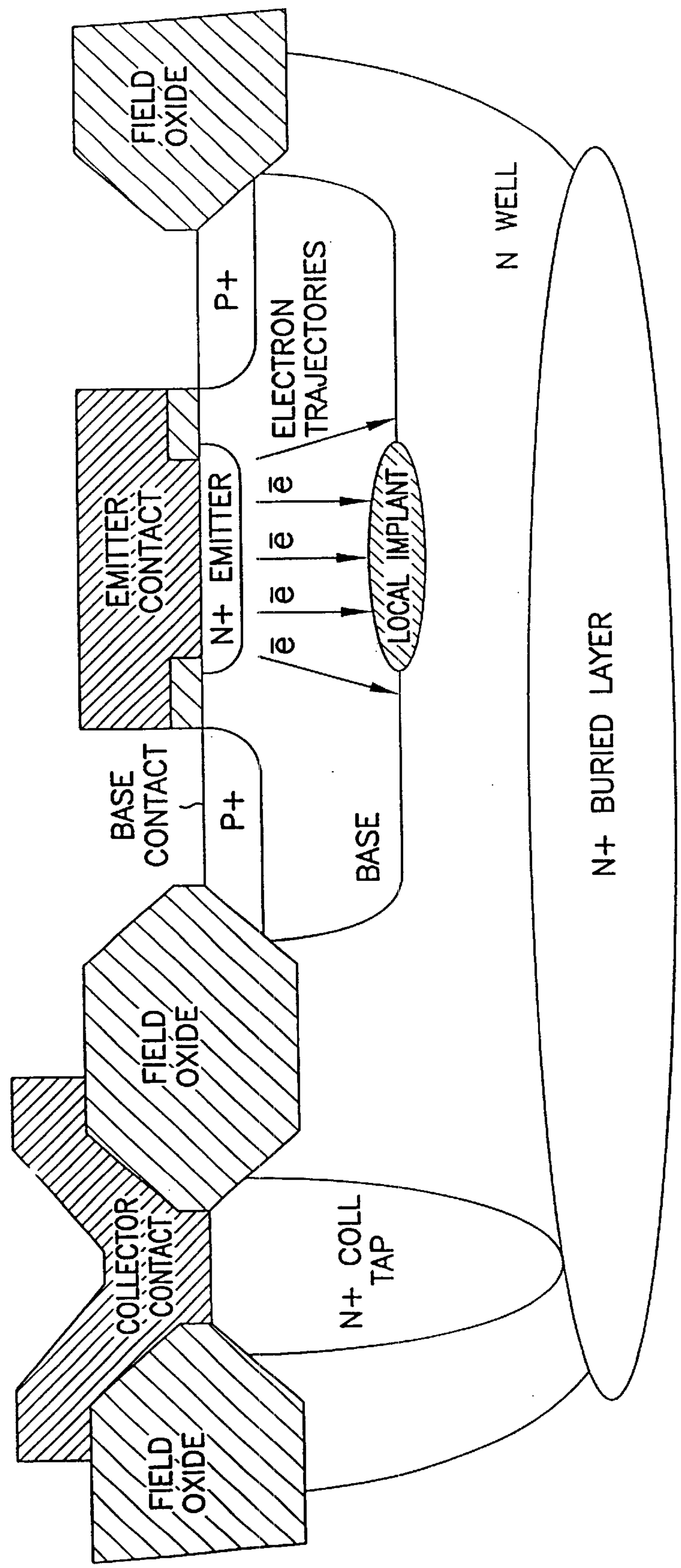
FIG. 2 is a cross section of a further prior art semiconductor transistor showing increased collector doping.
Figure 3:
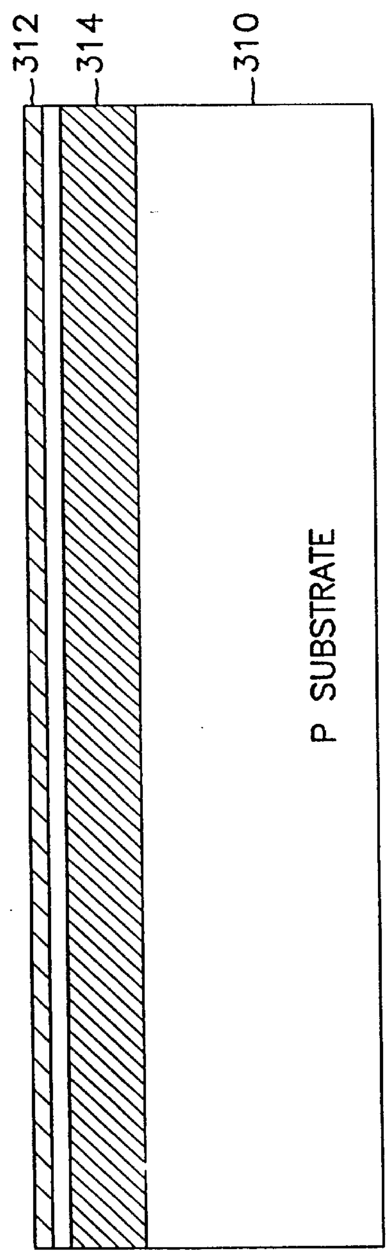
FIGS. 3–13 are cross sections of a semiconductor substrate at various stages, progressing from the initial substrate through the formation of a transistor having a collector implant in accordance with the present invention.

FIGS. 3 through 13 provide an overview of the steps involved in the formation of a typical npn bipolar transistor having an angled collector implant in accordance with the present invention. In FIG. 3, a p-type substrate of silicon 310 has a pad oxide 312 formed on its surface by standard deposition techniques. A p-well 314 is implanted via ion implant. A silicon wafer will have many such substrates contained on it, with circuitry being formed therein through multiple process steps as described below.

Figure 4:
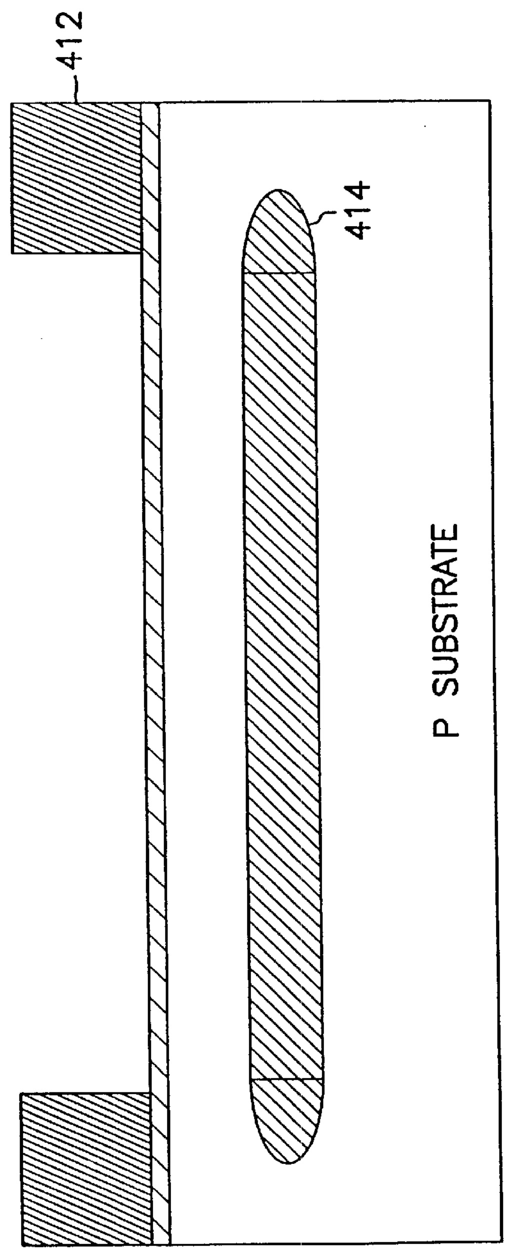
Figure 5:
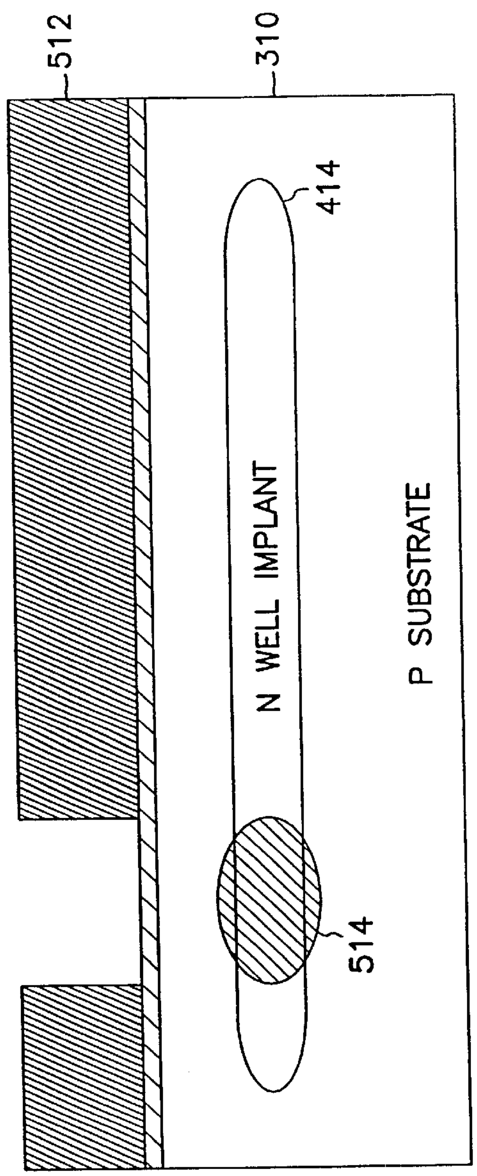
Figure 6:
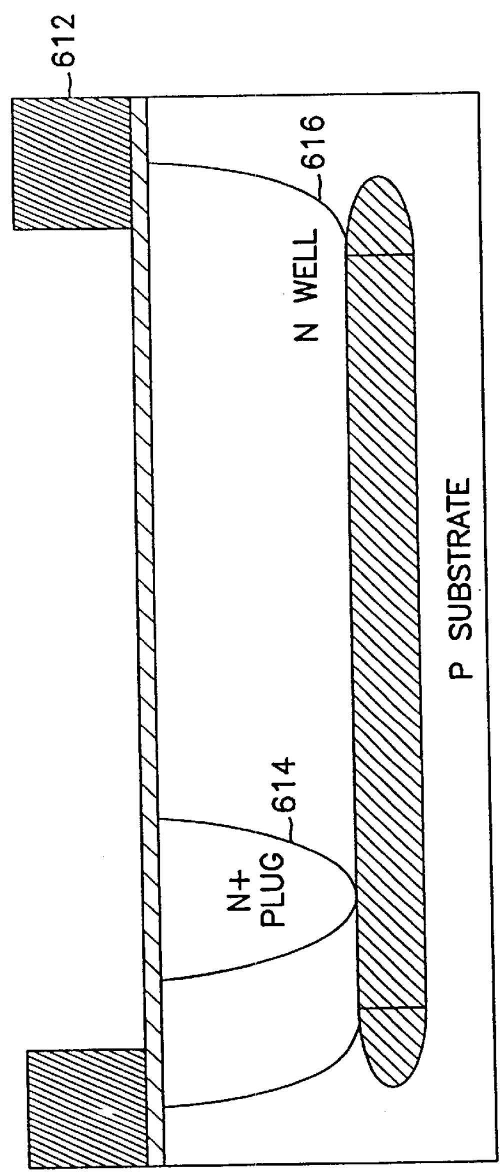
Figure 7:
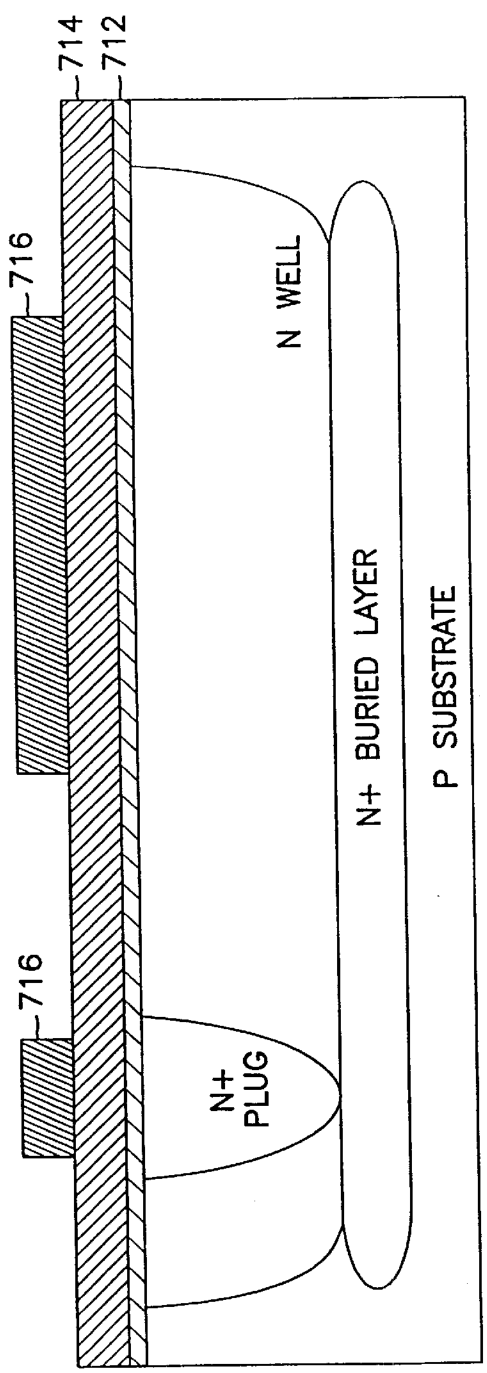
Figure 8:
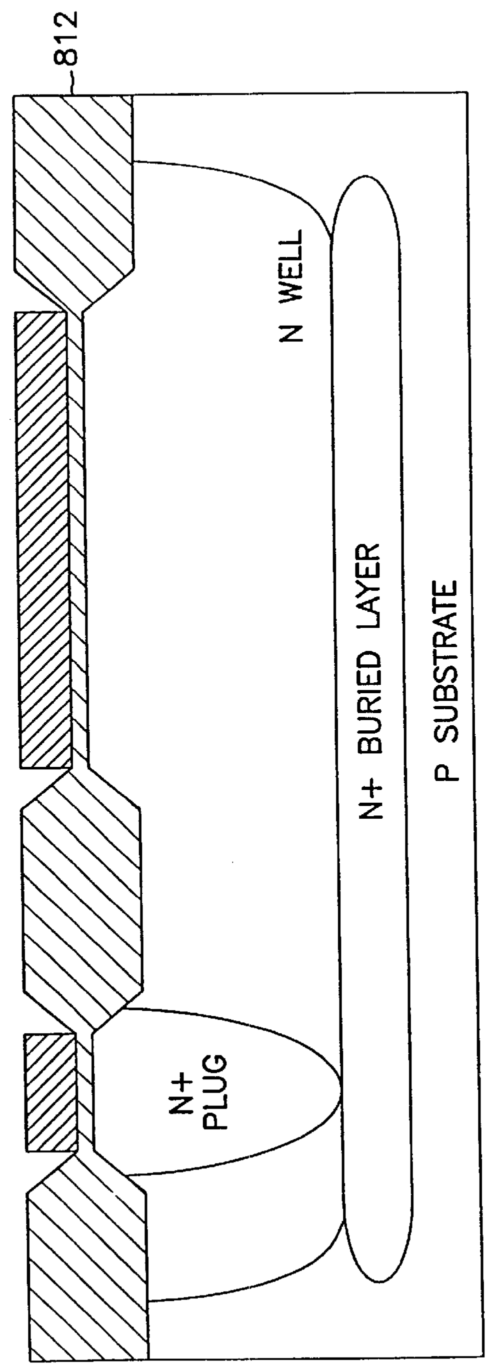
Figure 9:
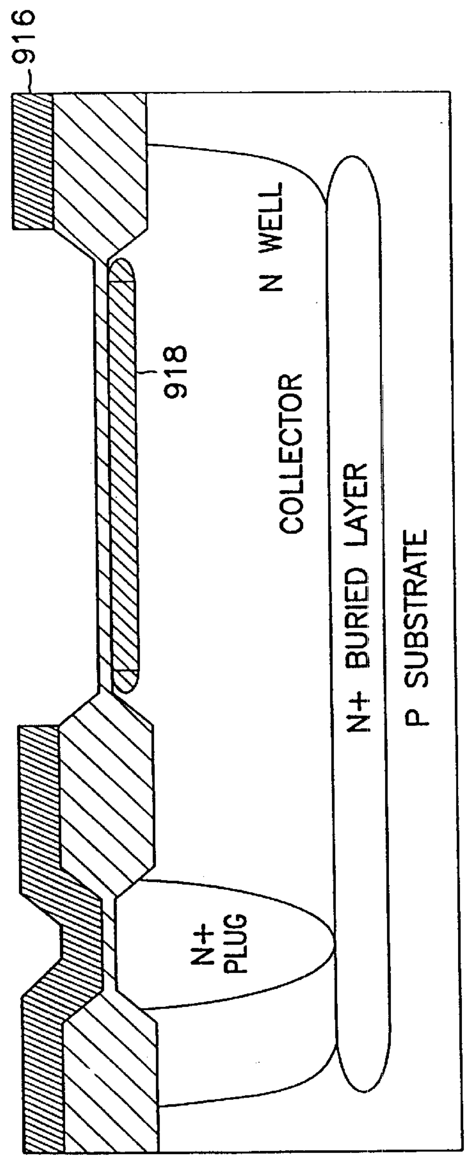

In FIG. 4, a photo resist layer 412 is applied and portions removed to allow the implant of an n-well layer 414 forming the basis for the collector. The remaining photo resist is removed, and, in FIG. 5, a new resist layer 512 is applied and selectively removed to permit the implant of a collector implant tap at 514. In FIG. 6, photo resist 612 is applied and selectively removed and a n+ plug 614 and N-well 616 are formed by implantation In FIG. 7, a pad oxide 712 and nitride 714 are deposited and covered by a photo resist 716 which is selectively removed to allow formation of a thick oxide layer where not covered by photo resist 716, and retain covered layers of nitride 714. The thick oxide layer is formed via field oxidation as indicated at 812 in FIG. 8. Photo resist 716 is then removed. Photo resist is again applied at 916 and a base 918 is implanted through the photo resist in FIG. 9.

Figure 10:
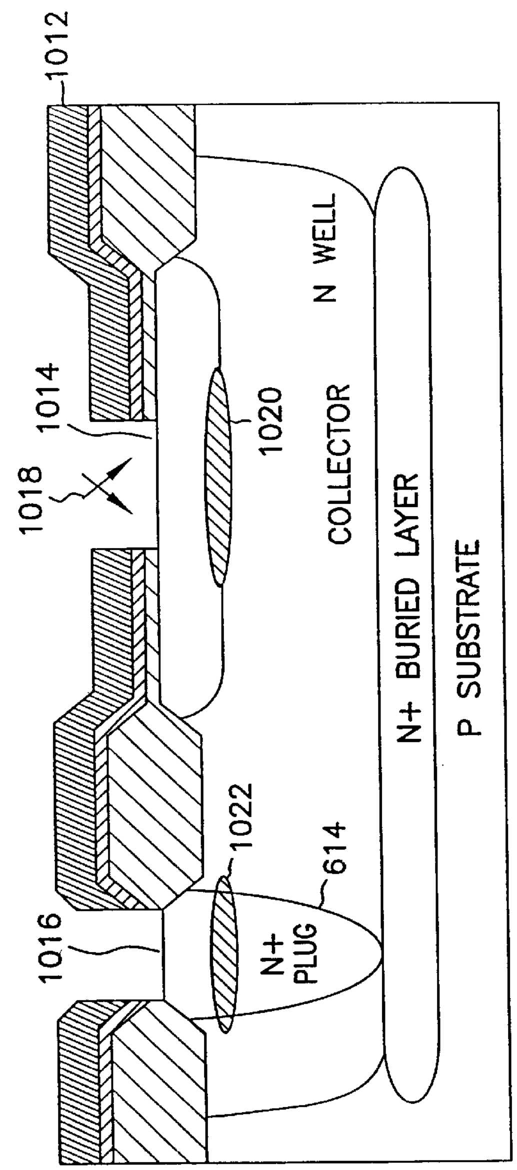

In FIG. 10, another photo resist layer 1012 is applied and selectively removed to expose an emitter opening 1014 and a collector opening 1016. An n-type impurity, such as phosphorous is implanted through such openings via ion implantation to form a collector implant 1020 at the collector-base vertical junction which is wide than the emitter opening 1014 and the eventual emitter. This has the benefit of preventing excess carriers generated at high current from traveling from the emitter to the collector, bypassing the base. Since the n+ collector implant 1020 does not cover the entire surface area of the base where it is vertically adjacent to the collector, the capacitance between the two layers is not greatly increased as in some prior art approaches. When referring to surface areas, it is defined as planes essentially parallel to the top surface fo the wafer. The effective surface area of the collector implant is greater than the surface area of the emitter opening, but less than the area of the base which is vertically adjacent said collector.

As opposed to a standard perpendicular implantation, the beam of ions is angled as shown at 1018, with an implantation angle from an imaginary line which is perpendicular to the surface of the substrate. The impurities are accelerated from the ion source, and a mass spectrometer is used to separate undesired impurities. A high energy, fairly narrow ion beam is focussed and raster scanned across the emitter opening at an implantation angle of about 20 to 30 degrees at the edges of the emitter, resulting in a wider implant 1020, which injected carriers have a harder time circumventing. The energy level of the beam will be dependent on the depth required to form the implant at the collector-base junction, and is easily determined by one skilled in the art. It is typically in the 50 to 150 keV range for most common processes. For a pnp transistor, a p-source of impurities is used, such as boron.

The angling of the beam is accomplished by use of wafer tilting features which are common on many ion implantation devices. The beam itself is usually rastered across the surface of a wafer containing at least one, and likely many thousands of transistors being formed The wafer is continuously tilted and then turned in one embodiment to form the implant. In a further embodiment, the angle is varied to produce reduced doping levels at the edges of the implant to obtain opal transistor high current operation. The implantation angle is in the range of 20 to 30 degrees from the perpendicular. In other embodiments, actual angles will depend on the desired size and depth of the implant and may vary from greater than zero, to angles that produce implants approaching the size of the base opening. Implantation horizontal surface areas greater than that normally available through the emitter opening using vertical implantation starts to provide the benefits of maintaining appropriate gains at high currents. Once the surface area of the implant approaches the surface area of the base opening, capacitive effects become too great, limiting the high frequency response of the transistor being formed. Shadows caused by opposite sides of the emitter opening may limit the angle that can be used, especially for deep collector-base junction implants. This is another case where the angle may be changed during the implant to obtain the total desired area of implantation.

Since the collector tap is also exposed to the ion beam, a second collector implant is formed at 1022 at about the same level of penetration as the increased collector doping under the emitter opening 1014.

Figure 11:
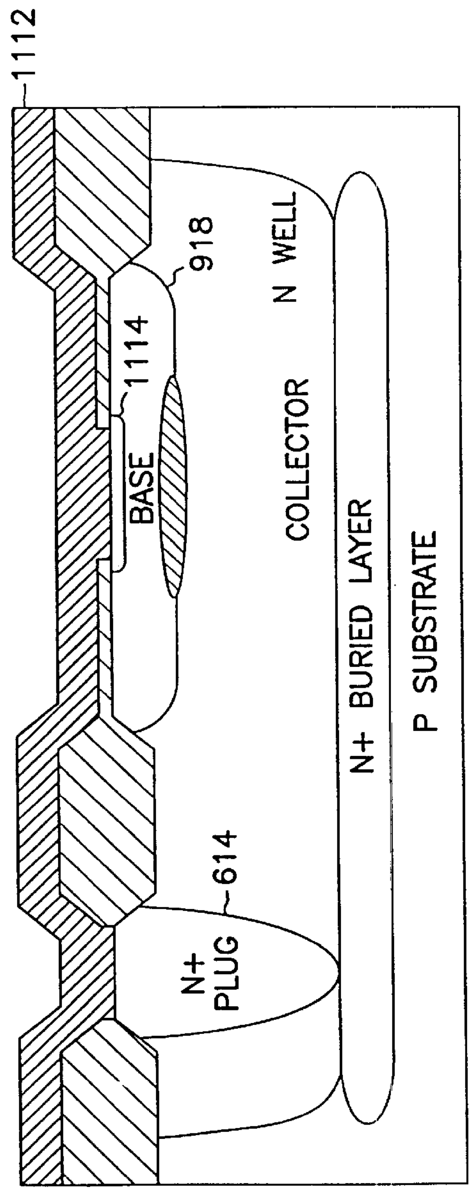
Figure 12:
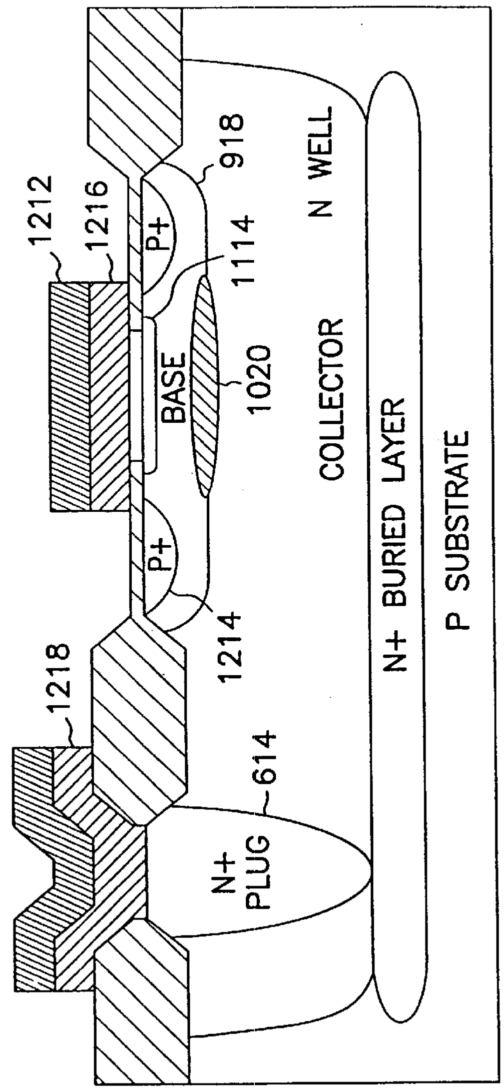
Figure 13:
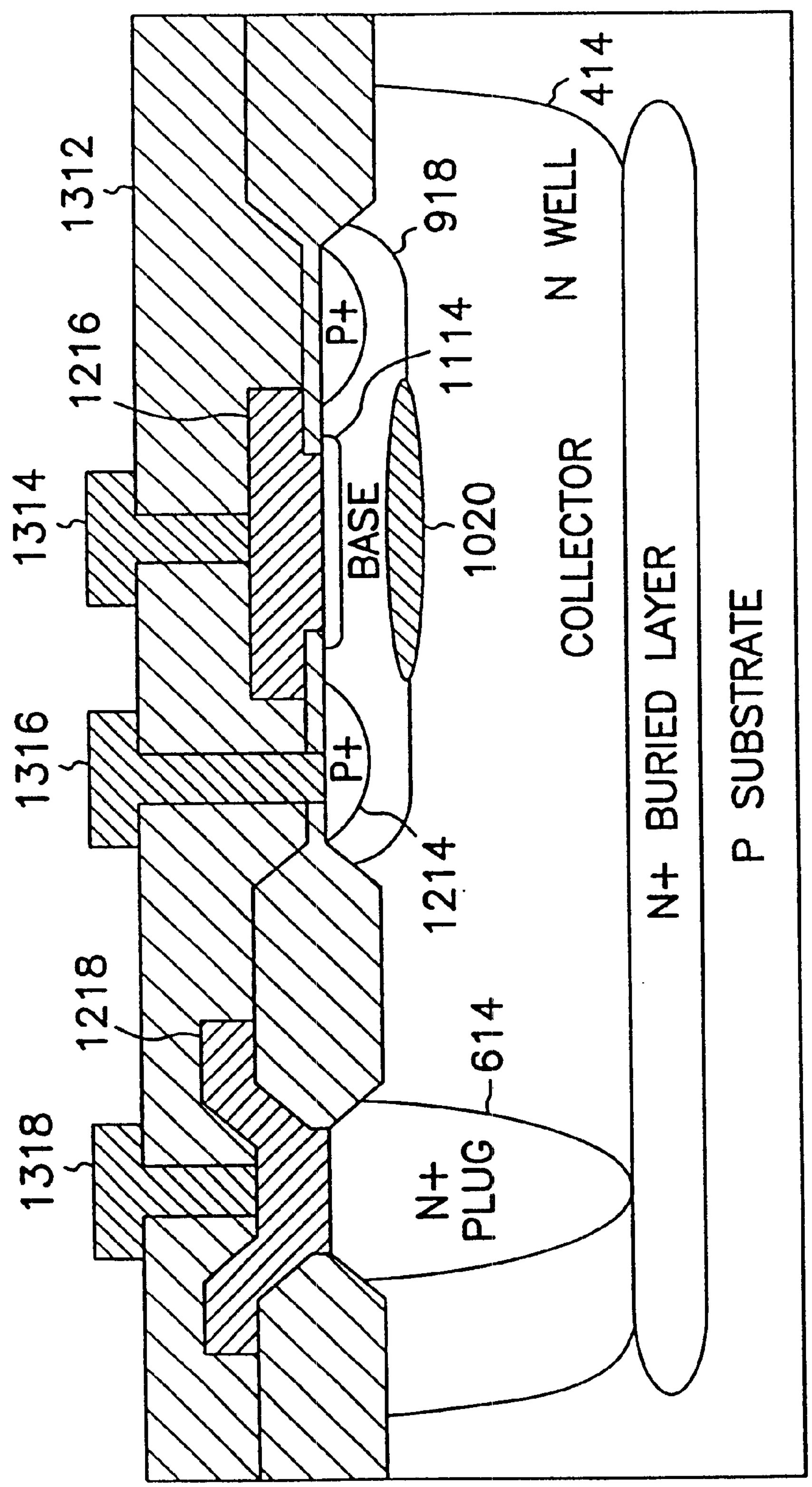

To finish the transistor and form contact to the active areas, a thick n+ polysilicon layer is applied at 1112 in FIG. 11, and a n+ polysilicon implant 1114 is done to form the emitter. It also provides for a good connection to the collector plug 614. In FIG. 12, photoresist 1212 is applied and selectively removed to allow removal of unwanted areas of n+ polysilicon 1112, leaving a pair of n+ polysilicon electrical contacts comprising n+ contact 1216 to the emitter 1114 and n+ contact 1218 to the collector plug 614. A p+ implant 1214 provides good contact to the base of the transistor which is now essentially formed. In FIG. 13, final oxide layer 1312 is deposited, and photo resist applied and selectively removed to form a mask for first etching the oxide and then performing a metal deposition of electrical contacts comprising an emitter contact 1314, base contact 1316 and collector contact 1318 which extend through oxide 1312 to contact the emitter, base and collector.

It is to be understood that the above description is intended to be illustrative, and not restrictive. In many cases, the doping of semiconductor structures may be reversed on a wholesale basis to obtain similar functions. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method, comprising:

forming a first conductivity region in a substrate, the substrate having a surface;

forming a collector region having a second conductivity type and extending downward from the surface of the substrate;

forming a base region having a surface area and extending downward from the surface of the substrate within a portion of the collector region;

forming an emitter opening on top of the base region, the emitter opening being smaller than the surface area of the base region;

forming a collector tap opening on the surface of the substrate spaced from the base region;

forming a first area of the collector region vertically adjacent the base region having an increased collector doping, the first area having an effective horizontal area greater than the emitter opening and less than an area of the base region which is vertically adjacent the collector region; and forming a second area of the collector region under the collector tap opening to have an increased collector doping and an effective horizontal area greater than the collector tap opening through which the second area is formed.

2. The method of claim 1, wherein forming the emitter opening includes forming an emitter in the emitter opening.

3. The method of claim 2, wherein forming the emitter includes introducing an impurity of the second conductivity type.

4. The method of claim 3, wherein forming the emitter is performed after at least one of forming the first area and forming the second area.

5. The method of claim 3, wherein forming the emitter is performed after forming the first area.

6. The method of claim 1, wherein forming the collector tap opening includes forming the collector tap opening in a resist layer on the surface of the substrate spaced from the base region.

7. The method of claim 6, wherein forming the emitter opening includes forming the emitter opening in a resist layer on the surface of the substrate essentially aligned with the base region.

8. The method of claim 1, wherein forming the first area includes implanting dopant through the emitter opening.

9. A method, comprising:

forming a first conductivity region in a substrate, the substrate having a surface;

forming a collector region having a second conductivity type and extending downward from the surface of the substrate;

forming a base region having a surface area and extending downward from the surface of the substrate into a portion of the collector region;

forming an emitter opening on top of the base region, the emitter opening being smaller than the surface area of the base region;

forming a collector tap opening spaced from the base region;

applying an ion beam to implant impurities at a depth consistent with an interface between the collector region and the base region to form a first area of the collector region vertically adjacent the base region, the first area having an increased collector doping, the first area having an effective horizontal area greater than an area of the emitter opening and less than an area of the base region which is vertically adjacent the collector region; and applying an ion beam to implant impurities at a depth consistent with the interface between the collector region and the base region to form a second area of the collector region through the collector tap opening, the second area having an increased collector doping and an effective horizontal area greater than the collector tap opening through which the second area is formed.

10. The method of claim 9, wherein at least one of applying the ion beam steps includes angling the ion beam with respect to the surface of the substrate such that the area of the implants are greater than the areas of the openings through which they are formed.

11. The method of claim 10, wherein angling the ion beam includes angling the ion beam in the range of about 20 to 30 degrees from an imaginary line perpendicular to the surface of the substrate.

12. The method of claim 9, wherein at least one of the applying the ion beam steps includes angling the ion beam relative to the surface of the substrate to result in the first area being larger than the second area.

13. The method of claim 12, wherein at least one of the applying the ion beam steps includes turning the substrate with respect to the ion beam to obtain a desired angle of implantation.

14. The method of claim 9, wherein at least one of the applying the ion beam steps includes tilting the substrate with respect to the ion beam to obtain a desired angle of implantation.

15. The method of claim 9, wherein at least one of the applying the ion beam steps includes applying an ion beam having an energy in the range of 50 to 150 keV.

16. A method, comprising:

providing a substrate;

forming a collector well in the substrate;

forming a base in the collector well such that a base-to-collector contact area is formed;

forming an implant region at a portion of the base-to-collector contact area such that the implant region forms a part of the base-to-collector contact area and has an implant region surface area;

forming an emitter in the base aligned with the implant region, wherein the emitter has a surface area less than the implant region surface area; and forming a collector tap in the collector well through an opening in the substrate, wherein the collector tap has an area greater than an area of the opening through which the collector tap is formed.

17. The method of claim 16, wherein forming the implant region includes applying an ion beam through an opening at a surface of the substrate to dope the implant region.

18. The method of claim 17, wherein applying the ion beam includes implanting impurities at a depth consistent with the base-to-collector contact area to form the implant region.

19. The method of claim 18, wherein applying the ion beam includes angling the ion beam with respect to the surface of the substrate such that an area of the implant region is greater than an area of the opening through which the implant region is formed.

20. The method of claim 19, wherein angling the ion beam includes angling the ion beam in the range of about 20 to 30 degrees from normal to the surface of the substrate.

21. The method of claim 19, wherein applying the ion beam includes tilting the substrate with respect to the ion beam to obtain a desired angle of implantation.

22. The method of claim 19, wherein applying the ion beam includes turning the substrate with respect to the ion beam to obtain a desired angle of implantation.

23. The method of claim 17, wherein applying the ion beam includes applying an ion beam having energy in the range of 50 to 150 keV.

24. The method of claim 17, wherein applying the ion beam includes applying the ion beam to a second location such that the second location is doped by the ion beam.

25. A method, comprising:

providing a substrate;

forming a collector well in the substrate;

forming a base in the collector well such that a base-to-collector contact area is formed;

masking the substrate to form an emitter opening at a surface of the base, the emitter opening having an emitter opening area;

forming an implant region at a portion of the base-to-collector contact area through the emitter opening such that the implant region forms a part of the base-to-collector contact area and has an implant region surface area;

forming an emitter in the base through the emitter opening, the emitter being aligned with the implant region and having a surface area less than the implant region surface area; and forming a collector tap in the collector well through a collector tap opening on the substrate, wherein the collector tap has a surface area greater than a surface of the collector tap opening through which the collector tap is formed.

26. The method of claim 25, wherein forming the implant region includes applying an ion beam through the emitter opening to dope the implant region.

27. The method of claim 26, wherein applying the ion beam includes implanting appropriate impurities at a depth consistent with the base-to-collector contact area to from the implant region.

28. The method of claim 27, wherein applying the ion beam includes angling the ion beam through the emitter opening such that the area of the implant region is greater than the emitter opening.

29. The method of claim 28, wherein angling the ion beam includes angling the ion beam in the range of about 20 to 30 degrees from normal to the surface of the substrate.

30. The method of claim 28, wherein applying the ion beam includes tilting the substrate with respect to the ion beam to obtain a desired angle of implantation.

31. The method of claim 28, wherein applying the ion beam includes turning the substrate with respect to the ion beam to obtain a desired angle of implantation.

32. The method of claim 26, wherein applying the ion beam includes applying an ion beam having energy in the range of 50 to 150 keV.

33. A method, comprising:

providing a substrate;

forming a collector well in the substrate;

forming a base in the collector well such that a base-to-collector contact area is formed;

masking the substrate to form a first opening and a second opening at a surface of the base, the first opening having a first area, the second opening having a second area;

forming an implant first region at a portion of the base-to-collector contact area through the first opening such that the first region forms a part of the base-to-collector contact area and has a first region surface area;

forming an implant second region through the second opening such that the second region has a second region surface area that is greater than an area of the surface opening; and forming an emitter in the base through the first opening, the emitter being aligned with the first region and having a surface area less than the first region surface area.

34. The method of claim 33, wherein the forming the implant second region includes forming the implant second region in the collector.

35. The method of claim 33, wherein forming the implant second region includes forming the second region surface to have a horizontal area greater than the second area.

36. The method of claim 33, wherein forming the first implant region and forming the second implant region include simultaneously applying ion beams through the first opening and the second opening.

37. The method of claim 36, wherein applying the ion beams includes angling the ion beams through the first and second openings.

38. The method of claim 37, wherein angling the ion beams includes angling the ion beam in the range of about 20 to 30 degrees from normal to the surface of the substrate.

39. The method of claim 36, wherein applying the ion beams includes tilting the substrate with respect to the ion beams to obtain a desired angle of implantation.

40. The method of claim 39, wherein applying the ion beams includes turning the substrate with respect to the ion beams to obtain a desired angle of implantation.

41. The method of claim 36, wherein applying the ion beam includes applying ion beams having energy in the range of 50 to 150 keV.

42. A method, comprising:

providing a substrate;

forming a collector well in the substrate;

forming a base in the collector well such that a base-to-collector contact area is formed;

masking the substrate to from an emitter opening at a surface of the base, the emitter opening having an emitter opening area;

rasterizing an ion beam over the substrate such that the ion beam transmits through the emitter opening to dope an implant region at a portion of the base-to-collector contact area, wherein the portion forms a part of the base-to-collector contact area and has an implant region surface area that is less than the base-to-collector contact area;

forming an emitter in the base through the emitter opening, the emitter being aligned with the implant region and having a surface area less than the implant region surface area; and wherein rasterizing includes transmitting the ion beam through a collector opening to dope a second implant region in the collector well such that the second implant region has a horizontal area greater than a horizontal area of the collector opening.

43. The method of claim 42, wherein rasterizing the ion beam includes implanting appropriate impurities at a depth consistent with the base-to-collector contact area to form the implant region.

44. The method of claim 42, wherein rasterizing the ion beam includes angling the ion beam through the emitter opening such that an area of the implant region is greater than the emitter opening.

45. The method of claim 44, wherein angling the ion beam includes angling the ion beam in the range of about 20 to 30 degrees from normal to the surface of the substrate.

46. The method of claim 42, wherein rasterizing the ion beam includes tilting the substrate with respect to the ion beam to obtain a desired angle of implantation.

47. The method of claim 42, wherein rasterizing the ion beam includes turning the substrate with respect to the ion beam to obtain a desired angle of implantation.

48. The method of claim 42, wherein rasterizing the ion beam includes applying an ion beam having energy in the range 50 to 150 keV.

* * * * *